United States Patent
Jiang et al.

(10) Patent No.: US 10,414,196 B1
(45) Date of Patent: Sep. 17, 2019

(54) OPTICAL SECURITY DEVICE HAVING HIDDEN IMAGES AND METHODS OF MAKING THE SAME

(71) Applicants: Yingqiu Jiang, Sunnyvale, CA (US); Aharon Hochbaum, Berkeley, CA (US)

(72) Inventors: Yingqiu Jiang, Sunnyvale, CA (US); Aharon Hochbaum, Berkeley, CA (US)

(*) Notice: Subject to any disclaimer, the term of this patent is extended or adjusted under 35 U.S.C. 154(b) by 18 days.

(21) Appl. No.: 15/583,845

(22) Filed: May 1, 2017

Related U.S. Application Data

(60) Provisional application No. 62/330,258, filed on May 2, 2016.

(51) Int. Cl.
| | | |
|---|---|---|
| *B42D 25/364* | (2014.01) | |
| *G02B 5/30* | (2006.01) | |
| *B42D 25/41* | (2014.01) | |
| *B42D 25/387* | (2014.01) | |
| *B42D 25/425* | (2014.01) | |

(52) U.S. Cl.
CPC ......... *B42D 25/364* (2014.10); *B42D 25/387* (2014.10); *B42D 25/41* (2014.10); *B42D 25/425* (2014.10); *G02B 5/3016* (2013.01)

(58) Field of Classification Search
None
See application file for complete search history.

(56) References Cited

U.S. PATENT DOCUMENTS

| | | | |
|---|---|---|---|
| 6,124,970 A | 9/2000 | Karassev et al. | |
| 7,679,701 B2 * | 3/2010 | Schadt | G02B 5/30 349/117 |
| 8,227,024 B2 | 7/2012 | Borovkov et al. | |
| 8,767,153 B2 * | 7/2014 | Yaroshchuk | C23C 16/26 349/123 |
| 8,885,121 B2 | 11/2014 | Quintana Arregui et al. | |
| 9,279,084 B2 * | 3/2016 | Dunn | C09K 19/586 |
| 2002/0017633 A1 * | 2/2002 | Goulding | C09B 67/0061 252/299.5 |
| 2012/0013831 A1 * | 1/2012 | Parri | G02B 5/3016 349/117 |

* cited by examiner

*Primary Examiner* — Ryan Crockett

(57) ABSTRACT

Disclosed herein is a transmissive or reflective optical security device, containing a hidden image, that is based on patterned retardation in a single layer of a nematic liquid crystal polymer on a substrate and methods of fabricating said hidden image by selectively modifying the retardation value. Fabrication methods that are compatible with high throughput standard roll-to-roll or printing lines are disclosed. Said image becomes visible under polarized illumination. The hidden image feature enhances the counterfeiting resistance of the security device.

14 Claims, 3 Drawing Sheets

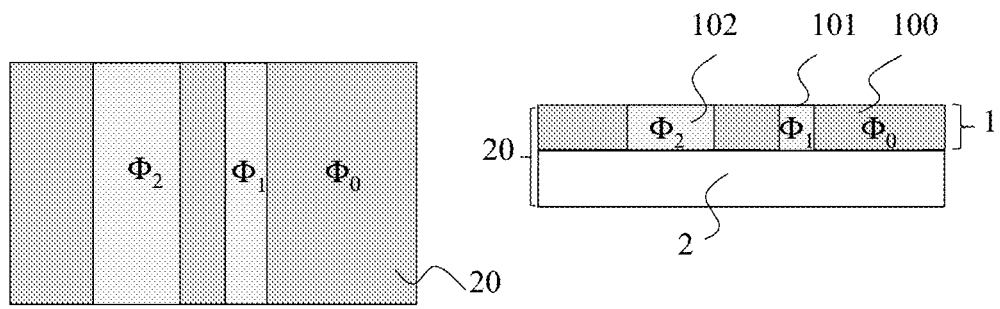
FIG. 1A
FIG. 1B
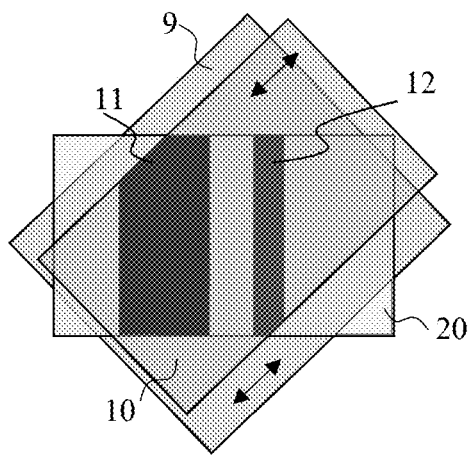
FIG. 2

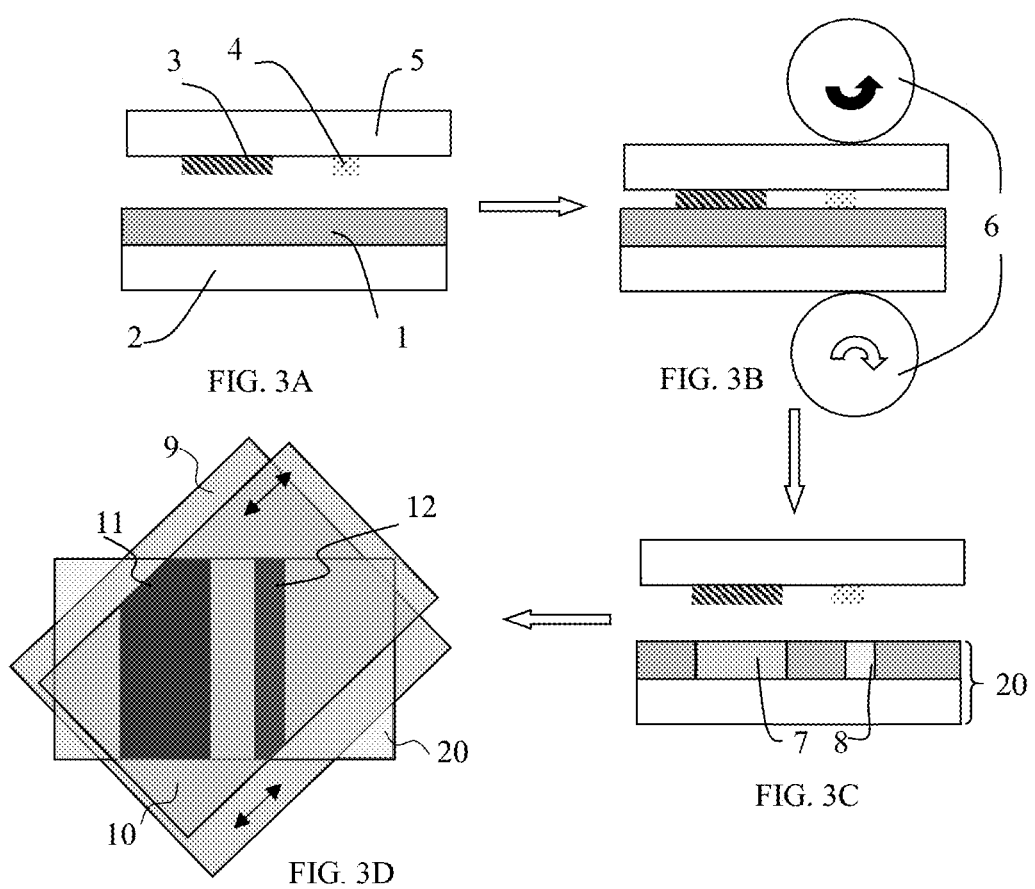

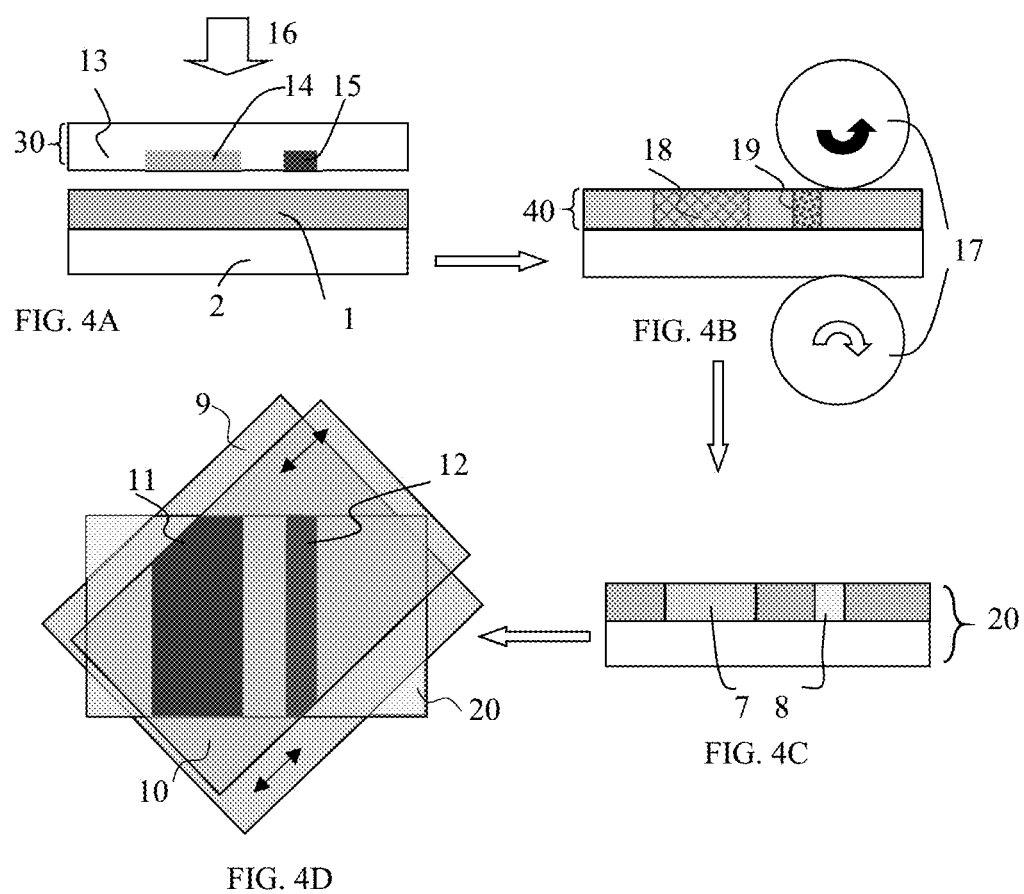

OPTICAL SECURITY DEVICE HAVING HIDDEN IMAGES AND METHODS OF MAKING THE SAME

CROSS-REFERENCE TO RELATED APPLICATION

This application claims priority under 35 U.S.C. §§ 119 (e) from U.S. provisional patent application No. 62/330,258, titled "METHODS OF PRODUCING MULTIPLE COLOR IMAGES IN A SINGLE LAYER OF CHOLESTERIC LIQUID CRYSTAL POLYMER" and filed on May 2, 2016.

BACKGROUND OF THE INVENTION

Counterfeiting of consumer goods, paper currencies, financial documents and identification cards is countered by a large variety of optical security measures designed to deter and defeat this illicit activity. Hidden image optical devices, where the images become visible only under polarized light, are particularly effective optical security devices for anti-counterfeiting and brand protection applications. Hidden image technology has been widely adopted by the optical security industry for document authentication, anti-counterfeiting measures, and brand protection applications. This optical effect is alternatively referred to as an "invisible image" or a "latent image" or a "covert image". Most of the hidden image technologies fall into two main categories: fluorescence-based, where the images become visible under UV or blue light illumination, and optical-anisotropy-based, where the images become visible under polarized light illumination. Hidden images of the latter technology are invisible when viewed with unpolarized light but can be seen when observed though simple sheet polarizers. For hidden image technologies based on optical anisotropy, namely, phase retardation, liquid crystal polymer has been chosen as a preferred material because it possesses large anisotropy and can be modified relatively easy using standard industrial processes.

Schadt et al. discloses in U.S. Pat. No. 7,679,701 a transmissive optical element having a substrate, a linear polarizer, a layer of photo-oriented polymer network (PPN, -LPP) and a nematic liquid crystal (NLC) polymer layer where the local orientation of the NLC molecules is determined by a patterned LPP layer. In selected discrete domains the orientation of the NLC molecules (equivalent to their optical axis) is different than that of the background area therefore an "image of orientation" is formed. However, this image remains hidden unless another polarizer is placed on top of the optical element. Areas where molecules are aligned at ±45° to the optical axis of the polarizer will have maximum or minimum transmission. Areas where molecules are aligned in other directions will appear to have different shades of gray. This particular device relies on a photo-oriented LLP polymer network material to create different optical axes of orientation. The LLP material and the optical alignment technique are non-standard and the latter requires specially designed tools and, therefore, the end product is expensive.

In U.S. Pat. No. 8,885,121 Quintana Arregui et al. teaches a device and a method of producing it for document security applications having multiple hidden images. The invention is based on a patterned, dichroic dye doped nematic liquid crystal polymer (NLCP) layer where the molecules in each patterned domain are aligned in a "twisted-nematic" (TN) configuration. The images are invisible when viewed with unpolarized light but each TN domain acquires a different gray shade when viewed through a polarizer. One advantage of this device is that the viewer can observe a different image from each side of the device. In addition, only one polarizer is needed for viewing the hidden image. However, to produce this device, one needs to employ a confinement plate, a non-standard manufacturing component, as an intermediate alignment substrate, which complicates its production. Additional concerns are the complexity of the process and the cost of materials.

In another class of hidden image technologies based on optical anisotropy, an anisotropic pattern is selectively induced in otherwise isotropic polymer layer. A number of processes can be used to impart a preferred orientation to randomly oriented anisotropic molecules in selected areas in such materials. Borovkov et al. discloses in U.S. Pat. No. 8,227,024, an isotropic polymer layer which is processed thermal-mechanically by generating micro-lines in selected areas. Due to mechanical stress, the above process induces locally a large optical anisotropy in a specific direction determined by the fabrication process. Differently processed domains have optical axes in different directions while the unprocessed background remains isotropic. This method provides a reliable way of producing large batch of repeatable hidden image labels. However, this process is relatively slow and has a low throughput since it relies on a digital plotting mechanism. In addition, the resolution of the hidden images is limited by the size of the plotting needles.

Karasev, et al. discloses in U.S. Pat. No. 6,124,970 a latent image device that is also based on variations in the direction of anisotropy in a polymer layer. The anisotropy is induced by exposing a special polymer and dopants to actinic radiation. This device offers a latent image with good contrast and good mechanical properties. However, its production process is complex: it uses a polarized light source to alter the anisotropy of the polymer, requires a lengthy pre-soaking of the polymer in a dopant solution and a time-consuming developing process, all of which make this device costly.

The current invention discloses an optical security device with a hidden image feature, comprising a single-layer nematic liquid crystal polymer (NLCP) having a uniform optical axis throughout said device, where different image domains differ in their retardation values. The current invention, furthermore, discloses a simple fabrication method which is roll-to-roll compatible, thus enabling a high throughput manufacturing process and a low-cost device, solving many of the difficulties associated with devices disclosed in the prior art.

The hidden image optical effect cannot be reproduced by counterfeiters employing standard reproduction techniques or using non-NLCP materials. Users of optical security devices prefer labels with multiple security levels for which NLCP is particularly suitable. Since NLCP are transparent in the visible range, hidden image devices can be overlaid on holographic based, or any other metallic based security devices, without obscuring the underlying information or optical effects.

SUMMARY OF THE INVENTION

The current invention is based on a nematic liquid crystal polymer layer having its molecules align on a substrate in a uniform, pre-defined direction. This nematic alignment configuration is known as "homogeneous alignment". Initially the monomer layer has a constant value of anisotropy or retardation throughout the entire area before being processed according to the current invention. First, the aforementioned NLC layer undergoes a partial polymerization process which yields a semi-cross-linked nematic liquid crystal polymer (NLCP) layer. The physical and optical properties of said NLCP layer can be modified by a local application of heat and pressure in selected areas using an appropriate mask and a laminator. As a result, the retardation values in said selected areas are modified. The resultant "retardation image", embedded in the NLCP layer, is invisible to an unaided eye. The hidden image is then converted into a visible gray-scale image when viewed with polarized light. Process parameters such as the degree of polymerization of the NLCP, as well as heat conduction of heat-transfer materials used in the mask, are the key factors to obtaining a good gray-scale hidden image in said optical security devices.

One aspect of the present invention is to provide practical methods for generating hidden images in a single NLCP layer that are compatible with batch production processes, roll-to-roll production lines and, in particular, with standard printing lines. This feature permits low cost and high throughput production of labels, laminates or any other optical security devices containing said hidden images without compromising the images' quality.

Additional important aspect of the current invention is to provide methods of fabricating custom and serialized images that are distinct one from another.

Yet another important aspect of the present invention is providing methods of generating halftone images that permit control of the number of grayscale levels and, thus, on the effective image brightness.

The basis for the production methods of hidden images in single NLCP layers disclosed herein, is a novel principle, backed by many experimental results, that a partially polymerized NLCP material can be handled like a solid polymer layer and yet remains responsive to external stimuli such as pressure and temperature. In many cases, the simultaneous application of high temperature and pressure, through appropriate masks, lead to a change of the NLCP's optical retardation values in domains selected by a mask. A useful elevated temperature range is typically 100° C.-200° C. The required pressure is in the range of commercial printers (e.g. laser printers) and laminators.

BRIEF DESCRIPTION OF THE DRAWINGS

FIG. 1 depicts an optical device having a single layer of nematic liquid crystal comprises domains with three distinct retardation values. FIG. 1A is the top view and FIG. 1B is a cross-sectional view, respectively of said device. The differences in optical retardation are not visible to the naked eye under unpolarized illumination.

FIG. 2 illustrates a method of making the hidden image visible using a pair of parallel polarizers, one on each side of the optical device.

FIG. 3 depicts the process steps of fabricating an optical device having a hidden image, using a heat-transfer mask. FIG. 3A is a cross-sectional view of a heat-transfer mask, printed on a substrate, before it is brought into contact with a layer of partially polymerized NLCP. FIG. 3B depicts a cross-sectional view of said heat-transfer mask and said NLCP being laminated together at elevated temperature and pressure. FIG. 3C illustrates a cross-sectional view of the resultant optical retardation distribution in said NLCP. FIG. 3D shows a top view of said hidden retardation image made visible using a pair of polarizers.

FIG. 4 depicts the process steps in fabricating an optical device, having a hidden image, using a UV photomask. FIG. 4A shows a cross-sectional view of a partially polymerized NLCP being exposed to UV radiation through a gray-scale photomask. FIG. 4B depicts a cross-sectional view the said NLCP, containing a latent image of different degrees of polymerization, being subjected to elevated temperature and pressure in a laminator. FIG. 4C illustrates a cross-sectional view of the resultant patterned optical retardation in said NLCP. FIG. 4D is a top view of said hidden retardation image becoming visible as a pattern of gray-scale stripes using a pair of polarizers.

DETAILED DESCRIPTION

The anisotropic (birefringent) optical devices discussed herein have a layer format and are generally known as retardation plates and more specifically: a-plates. Their optical axis is in the layer's plane and are characterized by their optical anisotropy: $\Delta n = n_e - n_o$, where $n_e$ is the refractive index experienced by light that traverses the plate linearly polarized along the optical axis (extra-ordinary component) and $n_o$, respectively, is for light linearly polarized perpendicular to the optical axis (ordinary component). When the light's linear polarization is at an arbitrary angle to the optical axis, the two components propagate at different speeds and accumulate phase at different rates. The light's polarization state, after traversing a retardation plate, depends on the phase difference between the e and the o components. The difference, known as "phase retardation", is given by: $\delta = 2\pi \cdot \Delta n \cdot d / \lambda$, where d is the plate thickness and $\lambda$ is the wavelength of light. Thus, the main effect of a retardation plate is to modify the light's polarization state.

The optical properties of retardation plates can be used to generate hidden images in a variety of ways. In most cases, a retardation-based hidden image becomes visible when it is illuminated by a linear or circularly polarized light and is viewed through a standard polarizer. Transmissive devices usually require two polarizers for visualization while for reflective devices a single polarizer accomplishes both functions. In a first class of devices, the retardation value is constant throughout the plate and distinct image elements have different optical axis directions. Light exiting from two different elements, has different polarization states and, therefore, when viewed through a standard polarizer, the two image elements appear to have different brightness (gray-scale). Since the naked human eye cannot distinguish between different polarization states of light, the image remains hidden under unpolarized illumination. In a second class of devices, the direction of the optical axis is constant throughout the plate but the retardation value is variable from one image element to the next. Different retardation values can be generated by varying locally the plate's thickness d or its anisotropy 4n or both. The associated differences in retardation values are translated into brightness variations by observing the plate through a standard polarizers. In few implementations, the material layer is isotropic before being processed and a retardation image is induced by a mechanical or optical process. The image background, for these implementations, remains isotropic ($\delta = 0$).

NLC monomers are particularly useful materials in retardation patterning applications since their anisotropy can be influenced by external stimuli. The anisotropy $\Delta n$ of NLC, for example, decreases with increased temperature, particularly near their LC-to-isotropic phase transition.

When all molecules in a layer of nematic liquid crystal are align in a unique direction in the plane of the layer (a homogenous configuration), it possesses a large degree of anisotropy and typically $\Delta n = 0.05 - 0.20$. The NLC layer appears transparent and colorless to the naked eye. When a NLC layer is inserted in between a pair of crossed linear polarizers, with its optical axis oriented at ±45° to the polarizers, a non-zero transmission value is usually observed. When the retardation of the NLC is a half-wave, the transmission of the sandwich configuration is maximal. Any retardation value between zero-wave and a half-wave yields intermediate transmission values between zero and the maximal value. Similarly, any retardation in between half-wave and a full-wave yields a transmission value between a maximal value and zero. Therefore, in order to achieve multi-level gray-scale hidden image, a process of selectively modifying the initial uniform retardation of a partially-polymerized NLCP layer becomes necessary.

When the substrate of the said NLCP is reflective, only one polarizer is required to make the hidden image visible. In this case, domains with a minimal or a maximal reflection can be achieved, for example by using retardation values between zero and a quarter-wave. Reflective hidden images devices are useful for multi-level security applications based on metalized security devices, such as holograms. Since the NLCP hidden image device is completely transparent, it can be applied on top of a hologram-based device, thus offering more security features in a single optical device.

The term "fully-cured" or its equivalent "fully polymerized" will mean herein that the NLCP is polymerized, usually by UV radiation, with a large dose such that it becomes effectively a solid and its physical and optical properties do not change significantly by further curing. It is well known that even a fully-cured NLCP contains a significant portion of monomers that are not fully polymerized but are, nevertheless, immobilized by the surrounding solid polymer network and, therefore, are unlikely to be polymerized by any further UV exposure.

By "partial curing" or "partial polymerization" it is meant herein that the NLCP is not fully-cured. Though a partially-cured NLCP may be solid enough to allow handling and processing, it was observed that few of its physical features, optical properties in particular, could still be modified by subsequent process steps. If heat or pressure are applied to a partially-polymerized NLCP, its optical properties can be modified.

The term "partially-polymerization" covers a wide range of states with different degrees of polymerization depending, for example, on the UV dose to which the NLC is exposed or on the oxygen concentration during curing. Smaller modifications in the NLCP optical properties are obtained when the NLCP layer is partially-polymerized with a higher UV dose. In the limit where the UV dose is very high, a fully-cured NLCP is achieved and no shift in the optical properties is observed when elevated temperature and pressure are applied to such a NLCP layer.

A typical retardation modifying process, as disclosed in the current invention, comprises the following general steps:
1. Mixing a NLC monomer and additives in a solvent
2. Coating said NLC mixture on a substrate
3. Solvent evaporation and then annealing of said NLC layer into a homogeneous configuration of the LC molecules.
4. Partial-polymerization of the entire NLC layer to form a NLCP layer.
5. Image addressing—addressing selected areas in said partially polymerized NLCP layer that are designated for a retardation modification to generate a latent image.
6. Image conversion—conversion of a latent image of polymerization or an external image (on a mask) into a multi-level retardation image in the NLCP layer.
7. Complete polymerization of the NLCP layer to freeze-in the image.
8. Applying a top coating at the NLCP-air interface.

Step 1-4 are common for all embodiments disclosed herein unless specifically indicated otherwise. The partial polymerization process is carried out by exposing the NLC to a controlled and metered dose of actinic radiation, e. g., a low dose of UV radiation.

FIG. 1 depicts an optical device 20 having a patterned single layer nematic liquid crystal polymer 1 deposited on a substrate 2, where the said NLCP comprises a hidden image of retardation. The retardation values in the image area 101 and 102, presented as $\Phi_1$ and $\Phi_2$ respectively, are different than that of the background area 100, $\Phi_0$. FIG. 1A is the top view and FIG. 1B is a cross-sectional view, respectively, of said NLCP. The differences in retardation values are invisible to the naked eye.

FIG. 2 illustrates in a top view of the revealing process of a hidden retardation image, of two gray-scale levels, with the aid of a pair of polarizers. In this configuration, the hidden image element 20 (the optical device of the current invention), is inserted in between a pair of linear polarizers 9, and 10. The optical axis of element 20 is oriented at 45° to the polarization axis of 9 and 10. Due to the difference in retardation, the transmission values of 11 and 12 are different than that of the background and two stripes of different gray-scale are observed.

In the following embodiment a heat-transfer mask is being used. It is made of a good heat conducting materials printed on a separate substrate. The substrate material, e.g. paper, is typically a poor heat-conductor compared with the printed material that protrude few micrometers above the substrate surface. The heat-transfer material may comprise carbon black particles or metallic particles or toner particles or silicon rubber particles or particulate inks having good heat conductivity. In addition, many polymeric materials can also be used as their thermal-conductivity need only be better than that of the substrate. Heat-transfer mask is printed on paper or polymer substrate in a separate operation, using digital thermal transfer printer or a laser printer or by other standard printing technologies such as flexo, gravure, screen printing or inkjet printing.

In a first embodiment, images in a heat-transfer mask, that was created in a separate process, are transferred (step 5) as shown in FIG. 3, into a retardation image in a partially polymerized NLCP. The image conversion (step 6) is implemented by temporarily laminating a heat-transfer mask onto a partially polymerized NLCP under elevated temperature and pressure. A hidden image is formed in this step, comprising of different retardation values in different domains of the image. FIG. 3A is a cross-sectional view of distinct heat-transfer materials 3, 4 printed on a substrate 5 which is then brought into contact with the said partially polymerized NLCP 1 and its substrate 2. FIG. 3B depicts a lamination process of said heat-transfer mask and NLCP through heated rollers 6. FIG. 3C illustrates a cross-sectional view of the resultant optical retardation pattern of two distinct domains, 7 and 8, having distinct retardation values that are different from the initial retardation of 1 in FIG. 3A, that now serves as the background. The hidden image in the optical device disclosed herein, 20, is invisible under unpolarized light. FIG. 3D is a top view of the hidden image in 20 being revealed through a pair of parallel linear polarizers 9, 10.

Multiple retardation values can be achieved with this method by printing heat-transfer masks having particles of different heat conductivities at different parts of the image. As a result, the heat-transfer image in the mask is converted into a multi-value retardation image in the NLCP layer.

A final complete polymerization step, usually carried out by subjecting the entire said NLCP to an intensive actinic radiation, is necessary to freeze-in the retardation pattern.

In a second embodiment, the heat-conductive material is colorless and transparent in the visible range. In this case, even if some of the heat-transfer material sticks to the NLCP after the conversion process step, the visual impact on the hidden image device is negligible, particularly after being index matched by a top coat layer.

Yet in a third embodiment, a transparent heat-transfer material has no separate substrate and is printed directly onto a partially polymerized NLCP. In this embodiment, the mask comprises only of the heat conductive material (3, 4 in FIG. 3A) and can be printed by any one of the previously mentioned mask printing methods. The printing of the mask on the NLCP is followed by a lamination step, as depicted in FIG. 3B, but without substrate 5. The printing of the mask becomes, in this embodiment, an integral part of the fabrication process of hidden images in a NLCP layer. The transparent mask material can be subsequently index matched optically by a transparent top coat, rendering the mask invisible in the final device. This embodiment can be particularly useful in fabricating serialized or, more generally, variable and distinct images.

The general term "UV mask" will mean herein: an optical photomask capable of blocking UV radiation. UV blocking can be accomplished by reflection or absorption. "Binary masks" have transmission that is approximately 0 or 1. Another class of masks is that of "truly grayscale" masks whose transmission can be adjusted to any arbitrary value between 0 and 1. The transmission of a grayscale mask can vary across the mask area in a continuous or discrete fashion. Binary or true grayscale masks are typically made of metallic coatings of variable thickness. They can be employed in projection mode or as proximity masks and are most suitable for the production of NLCP labels with fixed images.

Another useful type of UV mask is a "printed UV mask". Such a mask can be printed using, for example, a series of UV absorbing inks, each having a different degree of UV absorption. Images of the printed UV masks can be binary or truly grayscale or halftone images.

Grayscale UV masks can also be produced using a large variety of halftone printing techniques. Standard "halftone" printing refers to a reprographic technique that simulates grayscale levels through the use of distributed discrete, very small printed dots. Since human vision integrates the effect of sub-resolution features, a variation in the dots' size or spacing is perceived as a variation in grayscale levels. Halftone techniques are used, for example, by most industrial and office printers to generate monochromatic grayscale images. Halftone techniques are also used to produce a wide gamut of colors by colored printers. This is done by mixing dots of different colors and controlling the proportions of their relative areas. In standard printing, the perceived color includes a contribution from the spaces between the dots (e.g., white background when printing on white paper).

The UV absorbing materials can be organic dyes, soluble in water or solvents, or solid UV pigments or toners. While many dyes and pigments absorb in the UV and through the visible range, there are materials that absorb only in the UV and are essentially transparent in the visible range.

UV masks can employ UV absorbing inks or toners and take advantage of widely available inexpensive printing equipment. A variety of techniques can be used to print UV masks: inkjet, laser printing, screen printing, flexography or gravure printing.

Upon UV exposure of the NLCP through anyone of the above UV photomasks, different parts of the image will be polymerized to different degrees. Processing the heterogeneously and partially-cured NLCP at elevated temperature and pressure, modifies the retardation value of different image domains. As a result, when viewed with polarized light, different image domains become visible as they have different intensity transmission or reflection.

In a fourth embodiment, illustrated in FIG. 4, demonstrates yet another method of creating a hidden image in a partially polymerized NLCP layer. First, a grayscale patterned UV photomask 30 is placed in proximity to the top of an un-polymerized NLC layer 1 and said NLC is exposed to UV radiation from a UV source 16 through mask 30 (shown in FIG. 4A). The photomask 30 is designed such that the lowest transmission domain in the mask does not block UV completely and, therefore, the entire area of the device receives a minimum UV dose that is required for the least degree of partial polymerization. The patterned NLCP layer 40 (FIG. 4B) comprises distinct regions 18, 19 that are partially polymerized to different degrees—a grayscale of polymerization. When said patterned and partially polymerized NLCP layer is subjected to a uniform elevated temperature and pressure provided by heated lamination rollers 17, said regions 18, 19 undergo different degrees of change of their retardation values, thus generating a multi-level image of retardation (FIG. 4C) in domains 7 and 8 against the background retardation. The UV photomask can be positioned in proximity to the NLC or to its substrate side or be laminated in advance to the substrate.

In a fifth embodiment, a UV photomask that is transparent in the visible range is printed directly onto a partially polymerized NLCP. Said photomask stays on the NLCP for the rest of the process and becomes an integral part of the final device. The transparent UV photomask can be subsequently index matched optically by a transparent top coat, rendering the mask invisible in the final device. This embodiment can be particularly useful in fabricating serialized or, more generally, variable and distinct images.

In a sixth embodiment, a mask-less UV curing process is accomplished by partially polymerizing a NLC layer with a scanning UV laser. The laser beam provides the correct partial polymerizing dose to each point in selected areas on the NLC layer, or further cures an already uniformly partially polymerized NLCP. As a result, a latent grayscale image of polymerization is generated by the laser in the NLCP, which can be converted into a hidden image of retardation by applying elevated temperature and pressure. In one implementation, the UV laser is raster scanned and thus potentially addresses each point on the NLC. In this implementation, the image can be exposed to a higher or lower UV dose than the background. In another implementation, the entire NLC is uniformly partially polymerized by another UV source, e.g., a low-pressure Hg lamp, and only the image parts are addressed by the UV laser, possibly in a vector addressing mode. In the latter implementation, the image parts are exposed to higher UV doses than the background. The uniform curing can be executed before or after the laser scanning.

In a seventh embodiment, a heated engraved metal plate or a roller is embossed on a partially polymerized NLCP layer. Since the retardation of a partially polymerized NLCP can be altered by application of elevated temperature and pressure, the impact of the protruding parts of the engraved plate is to modify both the birefringence and film thickness in selected domains of said NLCP to create a hidden image.

For transmissive hidden image devices made with any of the embodiments disclosed above, the thickness of the NLCP layer in such retardation elements typically ranges from 0.5 micrometers to 3.7 micrometers and preferably from 0.9 micrometers to 2.7 micrometers.

For reflective hidden image devices made with any of the embodiments disclosed above, the thickness of the NLCP layer in such retardation elements typically ranges from 0.5 micrometers to 1.9 micrometers and preferably from 0.75 micrometers to 1.5 micrometers.

What is claimed is:

1. A fabrication method of an optical device with a hidden image in a single layer of nematic liquid crystal polymer (NLCP) which comprises:
   (a) coating a substrate with a layer of a reactive nematic liquid crystal (NLC) monomer mixture;
   (b) annealing said layer to form a homogeneously aligned NLC having a first retardation value;
   (c) partial polymerization of the entire area of said NLC layer to form a NLCP layer;
   (d) applying a retardation modification process to said NLCP to form a second retardation value or multiple additional retardation values in selected domains;
   (e) completely polymerizing said NLCP layer by applying high dose of actinic radiation; and
   (f) applying a top coating layer.

2. A fabrication method of an optical device as in claim 1, where said NLC mixture in step (a) comprises at least one reactive NLC monomer and at least one photo initiator.

3. A fabrication method of an optical device as in claim 1, where said substrate in step (a) is transparent.

4. A fabrication method of an optical device as in claim 1, where said substrate in step (a) is reflective.

5. A fabrication method of an optical device as in claim 1, where said first retardation value in step (b) is between a $\pi/2$ and $\pi$ and said second retardation value or multiple additional retardation values of step (d) are between zero and $\pi/2$.

6. A fabrication method of an optical device as in claim 1, where partial polymerization in step (c) is done by exposing said NLC layer to a controlled dose of actinic radiation.

7. A fabrication method of an optical device as in claim 1, where said retardation modification in step (d) is accomplished by temporarily laminating a mask, comprising one or multiple patterned transparent heat transfer materials on a substrate, to said partially polymerized NLCP followed by subjecting both to elevated temperature and pressure.

8. A fabrication method of an optical device as in claim 1, where said retardation modification in step (d) is accomplished by printing one or multiple transparent heat transfer materials onto said partially polymerized NLCP followed by subjecting both to elevated temperature and pressure.

9. A fabrication method of an optical device as in claim 1, where said retardation modification in step (d) is accomplished by exposing said partially polymerized NLCP to a controlled dose of UV radiation through a photomask followed by subjecting said NLCP to elevated temperature and pressure.

10. A fabrication method of an optical device as in claim 1, where said retardation modification in step (d) is accomplished by printing a UV mask onto said partially polymerized NLCP, where said mask comprises patterned UV absorbing materials that are transparent to visible light, and exposure to a controlled dose of UV radiation followed by subjecting both to elevated temperature and pressure.

11. A fabrication method of an optical device as in claim 1, where the said retardation modification in step (d) is accomplished by exposing selected areas of said partially polymerized NLCP to controlled doses of radiation from a UV laser followed by subjecting said NCLP to elevated temperature and pressure.

12. A fabrication method of an optical device as in claim 1, where said retardation modification in step (d) is accomplished by applying elevated temperature and pressure to selected areas in said partially polymerized NLCP by a laminator where one roller is engraved with an image and at least one roller is heated.

13. A fabrication method of an optical device as in claim 1, where said top coating in step (f) is clear or a lightly light diffusing layer.

14. An optical device with a hidden image fabricated by the method of claim 1 in the form of a label, a tag, a laminate or a card for the purposes of authentication, optical security or identification of articles of value, documents, banknotes, currency, ID cards or print products.

\* \* \* \* \*